United States Patent [19]

Lee

[11] 4,042,848
[45] Aug. 16, 1977

[54] HYPOCYCLOIDAL PINCH DEVICE

[76] Inventor: Ja Hyun Lee, 37 E. Governer Drive, Newport News, Va. 23602

[21] Appl. No.: 471,166

[22] Filed: May 17, 1974

[51] Int. Cl.$^2$ ........................................... H05B 31/22
[52] U.S. Cl. ................................. 313/231.6; 250/493; 315/111.2
[58] Field of Search ...................... 250/42 C, 499, 500, 250/423, 424, 425; 313/231.6, 231.5, 231.4, 231.3, 297, 298; 315/111.2, 111.3

[56] References Cited
U.S. PATENT DOCUMENTS

| 2,764,707 | 9/1956 | Crawford | 250/423 |
| 2,964,634 | 12/1960 | Harris | 250/501 |
| 3,746,860 | 7/1973 | Shatas | 250/402 |

Primary Examiner—Craig E. Church

[57] ABSTRACT

A hypocycloidal pinch device comprising three spaced apart coaxially aligned, annular electrodes; means for insulating the outer electrodes from the middle electrode; means for containing the spaced apart electrodes; means for charging the containing means with a working gas; and means for applying pulsed electrical energy between (a) the outer electrodes and (b) the middle to thereby produce along the coaxial axis a plasma of the working gas.

6 Claims, 4 Drawing Figures

HYPOCYCLOIDAL PINCH DEVICE

BACKGROUND OF THE INVENTION

1. Field of the Invention

This invention relates to devices for producing a dense plasma at thermonuclear-fusion temperature and, in particular, to such devices where the plasma is produced in large volume with long containment time.

2. Discussion of the Prior Art.

Among various devices in use for producing hot plasmas in thermonuclear fusion research, a type of device called a plasma focus apparatus is the most successful one with respect to the Lawson criteria on $n\tau$, where $n$ is the particle number density of a plasma and $\tau$, its confinement time. $n\tau$ of a plasma focus apparatus reaches $10^{12}$ which lies only two orders of magnitude below the value of the criteria for a sustained thermonuclear fusion. The operation and nature of the plasma produced by a plasma focus device are described in "Formation of a High-Density Deuterium Plasma Focus", by J. W. Mather, The Physics of Fluids, Vol. 8, No. 2, 1965, pages 366-377.

A schematic diagram of a typical plasma focus apparatus basically comprising two cylindrical electrodes is shown in FIG. 1.

Referring to FIG. 1, power is supplied by a capacitor band of 10 kJ or more of energy storage at 18 kV or more of charging voltage. When the circuit is closed by a fast switch, an electric breakdown occurs at the base of the coaxial electrode along the surface of the insulator as indicated in FIG. 1. Subsequently, the current sheet is accelerated toward the end of the electrodes by $\vec{J} \times \vec{B}$ force where $\vec{J}$ is current density and $\vec{B}$ is magnetic induction. The pressure of the working gas and the length of the electrodes are initially adjusted so that the peak current appears when the current reaches the end of the electrode. Due to the configuration of the conducting surface the current sheet collapses violently toward the axis of the electrode producing a dense and hot plasma, called a plasma focus, in a volume of $\sim 0.01$ cm$^3$ at a half inch above the center electrode. When the working gas is deuterium, d-d reactions take place in the plasma and $10^9$–$10^{11}$ neutrons per discharge are emitted. Typical plasma parameters are: particle density —$10^{19}$/cm$^3$; plasma temperature —2 to 5 keV or 20 to 50 million degrees Kelvin; shape —1 mm diameter and a few cm long cylindrical form sustainment time —typically 100 nanoseconds.

The plasma-focus apparatus currently is use has thus far no control over the duration of the sustainment (typically 100 nsec) and the size of the hot plasma (1 mm diameter). There has been an effort to scale up to neutron production in plasma focus devices by increasing input energy and the size of electrodes but results show no appreciable increase in both the sustainment time and the plasma volume. Use of a large electrode does not solve these limitations. A diameter of the center electrode up to 48 cm has been used but no appreciable changes on these limitations were possible. Further, due to its geometry it is difficult to form a system with two or more of such apparatus for higher performance.

As stated above plasma focus apparatus is the most successful one in approaching Lawson's criterion for thermonuclear fusion reaction. However, it is difficult to extend to a large-scale reactor development due to its geometrical limitations. Attempts to couple two plasma focuses have also been unseccessful for devices of the type described in FIG. 1.

SUMMARY OF THE INVENTION

A primary object of this invention is the provision of apparatus for producing a dense plasma at thermonuclear-fusion temperature in a larger volume and longer containment time than obtainable with pulsed devices currently used in thermonuclear fusion research.

A further object of this invention is the provision of apparatus of the above type utilizing a novel geometry of electrodes for producing the plasma focus, the electrodes being arranged in single or multiple module embodiments.

A further object of this invention is the utilization of apparatus of the above type in such applications as a high flux neutron or X-ray source.

Other objects and advantages of the invention will become apparent after a reading of the specification and claims taken with the drawing.

DETAILED DESCRIPTION OF PREFERRED EMBODIMENTS

Figure 1:
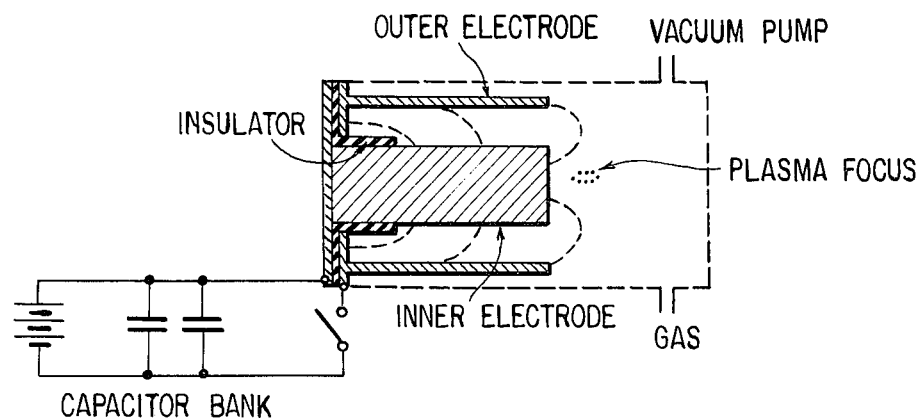
FIG. 1 is a schematic view of an illustrative plasma focus apparatus of the prior art.
Figure 2:
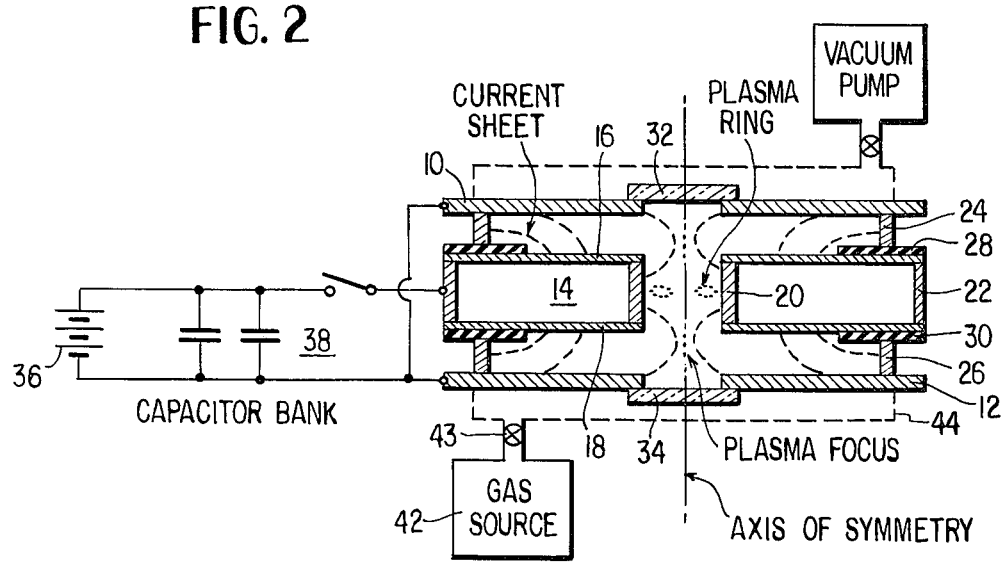
FIG. 2 is a schematic cross-sectional view of an illustrative, single module embodiment of the invention.

Referring to FIG. 2, there is shown a schematic cross-sectional view of an illustrative embodiment of the invention. Rather than using the concentric cylindrical electrodes of the prior art as shown in FIG. 1, annular discs are employed, as shown in FIG. 2, in the pinch device of this invention. These annular discs comprise an upper outer disc or electrode 10, a lower outer disc or electrode 12, and a middle electrode generally indicated at 14. Middle electrode 14 comprises an upper disc 16 and a lower disc 18. Discs 16 and 18 are electrically connected by inner ring 20 and outer ring 22. Thus, middle electrode 14 as shown in FIG. 2 is hollow, however, if desired, electrode 14 may be of solid construction. Middle electrode 14 is supported between upper disc 10 and lower disc 12 by rings 24 and 26, insulating annular discs 28 and 30 being respectively interposed between rings 24 and 26 and middle electrode 14. Windows 32 and 34 may be respectively disposed over the openings of discs 10 and 12, the windows being transparent to whatever radiations are emitted into or from the pinch device.

Power supply 36, which may be a battery or any other appropriate source of electrical power, is connected to a capacitor bank generally indicated at 38, which, in turn, is connected to (a) middle electrode 14 and (b) outer electrodes 12 and 10 via switch 40. The electrical connection in FIG. 2 between the capacitor bank and the electrodes may also be effected by utilizing four cables for each capacitor of the bank where two of each four cables would be connected to discs 10 and 16 respectively and the other two to discs 12 and 18 respectively.

The working gas such as deuterium is charged in the pinch device by a gas source 42 connected via valve 43 to a vacuum enclosure 44, the upper and lower sides of which are transparent to the radiation emitted by the pinch device. A vacuum (1 torr, for example) is established in the pinch device by a vacuum pump 48 connected via valve 50 to the vacuum enclosure 44.

From the foregoing it can be seen there are two disc cathodes 10 and 12 and a common disc anode 14. Two current collapse radially toward the center of the apparatus. The initial breakdown takes place over the surface of insulators 28 and 30. The current sheets are rapidly detached from the surface by the inverse pinch force. This minimizes the evaporation of insulator material into the current sheets. Furthermore, the geometry contributes to the symmetrical shaping of current sheets. The hole on the axis of the center electrode allows the current sheets to interact and form a pinched discharge region resembling a hypocycloid in shape and thus the plasma undergoes a three-dimensional compression in the center hole.

Typical, but non-limiting parameters for the system of FIG. 2 may be as follows.

| Power Supply 36 | |
| --- | --- |
| Operating voltage | 20 kV DC |
| Charging current | 60 mA |
| Capacitor Bank 38 | |
| Total capacitance | 125 μF |
| Energy storage | 25 kJ |
| Charging voltage | 20 kV |
| Pinch Device | |
| Electrodes 10, 12, and 14, copper disc | 20 in. O.D. |
| Upper electrode 10 | ¼in. thick |
| Middle electrode 14 | 2 in. thick |
| Lower electrode 12 | ¼in. thick |
| Insulators 28 and 30 between electrodes - fiberglass and pyrex glass | |

Since the production of a hot plasma strongly depends on the input energy, the capacitor bank energy may be increased as large as a few megajoules to have X-ray or neutron production suitable for practical usage. The dimensions of the pinch device may be varied to match the impedance of the electrical circuit. To adopt the invention for thermonuclear power generation further sophistification is necessary. For a faster repetition rate, a transmission-line type power supply in place of capacitor bank 38 may be used. A power train of more than 50 kJ per pulse and repetition rate as fast as 1000 Hz may be employed.

In the testing of one prototype of this invention, preliminary results with a 20-cm-diameter apparatus energized by a 30-kJ capacitor bank established that a hot and dense plasma was produced on the axis of the apparatus as the time of peak current. This plasma, observed in pictures with bremsstrahlung emission taken in the streak mode had a diameter of 5 mm and was radially stable for $>5$ $\mu$s. A plasma density of $>10^{18}$/cm$^3$ and a temperature of $<1$ keV were estimated from snow plow calculations and from bremsstrahlung emission. Low level neutron production from the d-d fusions was also observed with a filling pressure of 1 torr of deuterium.

In operation, the pinch device is first charged with the working gas from source 42. Next, capacitor bank 38 is charged from supply 36. The electric circuit is then closed by simultaneously closing switch 40. This results in the production and pinching of hot plasma sheets with attendant nuclear fusion with neutron and X-ray emissions. The nuclear fusion may thus be utilized.

The following advantages of the invention over prior art thus result:

1. The volume of hot plasma can be easily increased. The hot plasma produced in the invention forms a ring, the diameter of which is determined by the inner hole of the electrodes. Therefore, the volume of the plasma can be varied at will. In the prior art plasma focus device, the volume of plasma is affected little by the size of electrodes. The larger volume of plasma in the subject invention together with its stability and open geometry permit easy coupling with a laser or electron beam for further heating.

2. Plasma stability is improved. The plasma ring produced in the invention is a more stable geometry than the cylindrical form of the prior art plasma focus. Since compression is three dimensional, longer confinement times result.

3. The symmetrical geometry of the pinch device of the present invention makes its construction simple. The major component of the invention is disc shaped and thus simple to construct. Any number of sets can easily be joined to form a high-power system, as will be described in more detail hereinafter with respect to FIG. 3.

4. The invention can be scaled up for high power operation with little trouble since there is no limiting factor in the mechanism of the invention.

5. The invention can easily accommodate electron or proton beam injection. When combined with a laser, it should enhance X-ray production significantly, as is illustrated in FIG. 4.

Features of the invention which are thought to be particularly unique are: (1) the unique arrangement of disc-shaped electrodes in a plasma pinch device; (2) the production of a dense and hot plasma in the form of a ring, together with two Filippov-type plasma foci; (3) a plasma volume which can be varied by varying electrode size; (4) better stability and less leakage of plasma by the virtue of the closed and symmetric form of the invention; and (5) the arrangement of FIG. 2 can be used as a module for a larger system, as shown in FIG. 3.

Figure 3:
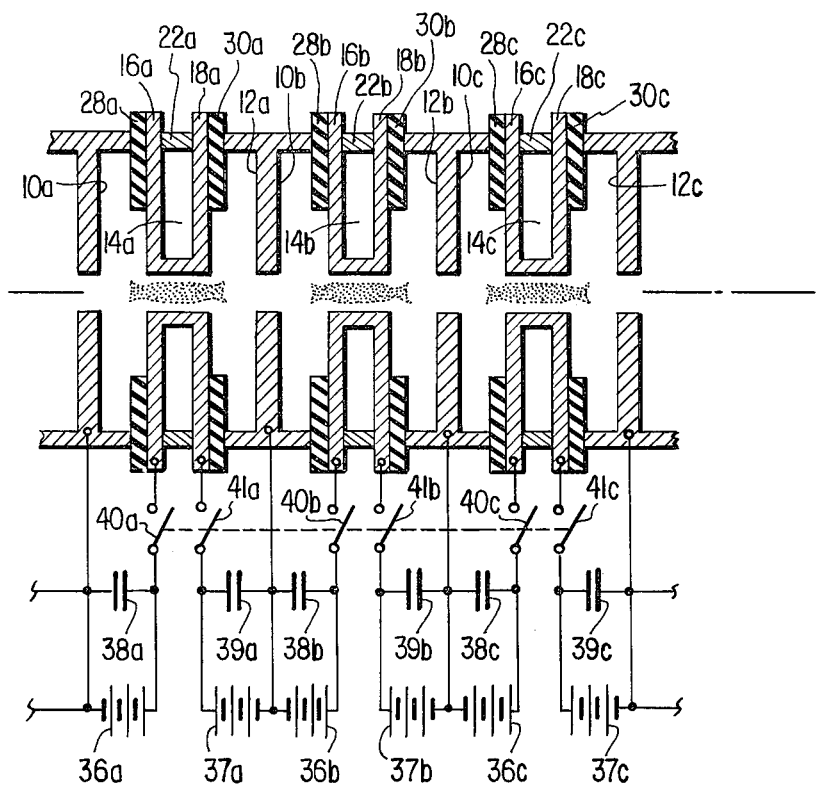
FIG. 3 is a schematic cross-sectional view of an illustrative multiple module embodiment of the invention.

Referring to FIG. 3, there is disclosed a multiple module or array form of the invention. This form is useful whenever a high performance linear or toroidal system is desired. As can be seen from FIG. 3, the pinch device of FIG. 2 readily lends itself to the multiple array structure. Thus, each element of FIG. 3 corresponding to a given element of FIG. 2 has the same reference numeral as that element followed by a letter designating the module with which it is associated, there being modules a, b, and c shown in FIG. 3. Note that the separate faces of certain elements of FIG. 3 respectively correspond to separate electrodes of FIG. 2. Thus, for example, one face of one of the FIG. 3 elements corresponds to electrode 16a while the other face thereof corresponds to electrde 10b. In operation, the switches 40a, 41a, 40b, 40c, 41c, . . . are preferably ganged for simultaneous closing.

Figure 4:
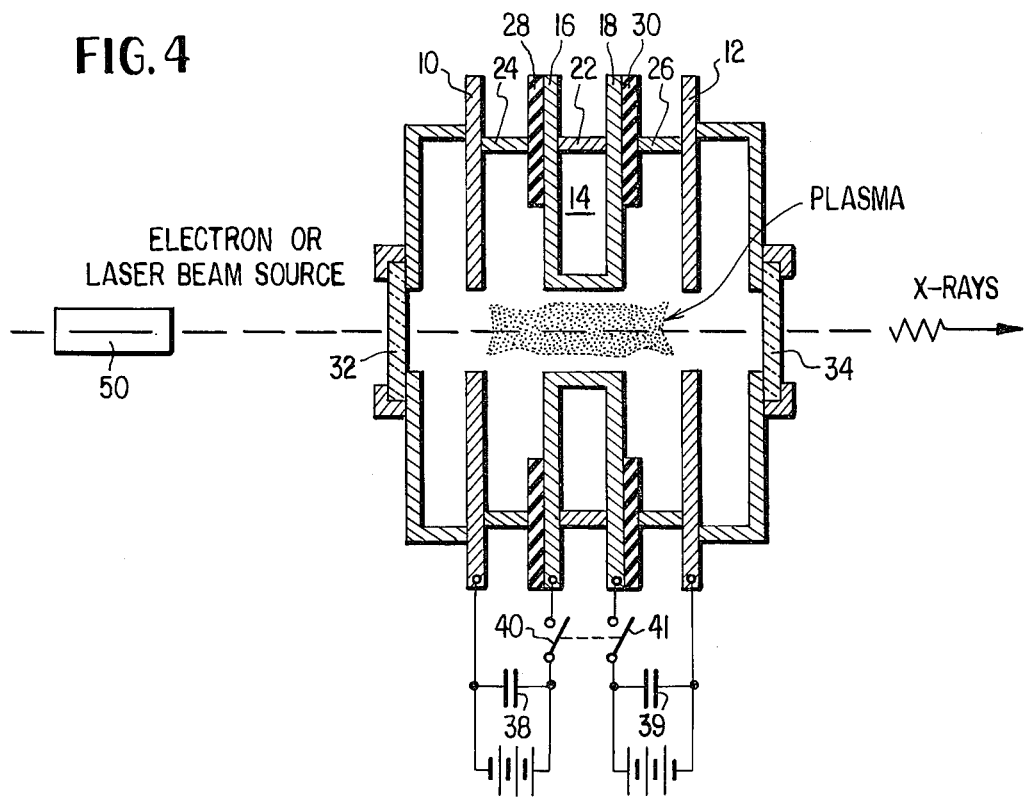
FIG. 4 is a schematic cross-sectional view of an illustrative X-ray generator utilizing the apparatus of this invention.

Referring to FIG. 4, there is shown an adaptation of the FIG. 2 embodiment in combination with a laser or electron beam source 50 for producing X-rays.

What is claimed is:

1. A hypocycloidal pinch device comprising
three spaced apart, coaxially aligned, annular electrodes where a middle electrode is disposed between two outer electrodes;
means for containing said spaced apart electrodes;

a first ring disposed between said middle electrode and one of said outer electrodes at the approximate outer edges thereof;

a second ring disposed between said middle electrode and the other one of said outer electrodes at the approximate outer edges thereof, said first and second rings being respectively connected to said outer electrodes;

means for insulating the first and second rings from the middle electrode, said insulating means comprising first and secnd insulative annular discs respectively disposed on the upper and lower surfaces of said middle electrode at the approximate outer edge thereof, said first and second rings respectively contacting said first and second insulative annular discs, the inner diameter of said discs being less than the inner diameter of said rings and greater than the inner diameter of said middle electrode;

means for charging said containing means with a working gas; and means for applying pulsed electrical energy between (a) said outer electrodes and (b) said middle electrode to thereby initially produce a first plasma of said working gas in the vicinity of the inner edge of said first annular insulative disc across said first ring and the approximate outer edge of the upper surface of said middle electrode and a second plasma of said working gas in the vicinity of the inner edge of said second annular insulative disc across said second ring and the approximate outer edge of the lower surface of said middle electrode, said first and second plasmas being radially transferred and compressed to the inner edge of said middle electrode where they are brought together along the axis of said electrodes and further compressed into a single dense plasma.

2. A device as in claim 1 where said three electrodes comprise a module and a plurality of modules are coaxially aligned in a said container.

3. A device as in claim 2 where adjacent end electrodes of successive modules are respectively disposed on opposite faces of a common element.

4. A device as in claim 1 including source means for projecting a beam of a first energy type into said plasma to produce therefrom a second energy type.

5. A device as in claim 4 where said source means comprises an electron or laser beam source and said second energy type is an X-ray beam.

6. A hypocycloidal pinch device comprising three spaced apart, coaxially aligned, annular electrodes where a middle electrode is disposed between two outer electrodes;

means for containing said spaced apart electrodes;

a first ring disposed between said middle electrode and one of said outer electrodes at the approximate outer edges thereof;

a second ring disposed between said middle electrode and the other one of said outer electrodes at the approximate outer edges thereof, said first and second rings being respectively connected to the upper and lower surfaces of said middle electrode;

means for insulating the first and second rings from the outer electrodes, said insulating means comprising first and second insulative annular discs respectively disposed on the inner surfaces of said outer electrodes at the approximate outer edges thereof, said first and second rings respectively contacting said first and second insulative annular discs, the inner diameter of said discs being less than the inner diameter of said rings and greater than the inner diameter of said middle electrode;

means for charging said containing means with a working gas; and means for applying pulsed electrical energy between (a) said outer electrodes and (b) said middle electrode to thereby initially produce a first plasma of said working gas in the vicinity of the inner edge of said first annular insulative disc across said first ring and the approximate outer edge of the inner surface of said one outer electrode and a second plasma of said working gas in the vicinity of the inner edge of said second annular insulative disc across said second ring and the approximate outer edge of the inner surface of said other outer electrode, said first and second plasmas being radially transferred and compressed to the inner edge of said middle electrode where they are brought together along the axis of said electrodes and further compressed into a single dense plasma.

* * * * *